United States Patent [19]
Miller

[11] Patent Number: 6,137,346
[45] Date of Patent: Oct. 24, 2000

[54] TEMPERATURE TRACKING VOLTAGE TO CURRENT CONVERTER

[75] Inventor: Charles A. Miller, Fremont, Calif.

[73] Assignee: Credence Systems Corporation, Fremont, Calif.

[21] Appl. No.: 09/067,314

[22] Filed: Apr. 27, 1998

[51] Int. Cl.[7] .................................................. H03K 1/10
[52] U.S. Cl. ........................ 327/538; 327/101; 323/315
[58] Field of Search .................................. 327/101, 538, 327/540; 323/315; 371/27.1

[56] References Cited

U.S. PATENT DOCUMENTS

| | | | |
|---|---|---|---|
| 4,906,915 | 3/1990 | Abdi | 323/316 |
| 5,151,903 | 9/1992 | Mydill et al. | 371/27.6 |
| 5,581,177 | 12/1996 | Hussey et al. | 324/158.1 |
| 5,631,599 | 5/1997 | Bacrania et al. | 327/542 |
| 5,913,022 | 6/1999 | Tinaztepe et al. | 395/183.01 |

*Primary Examiner*—Terry D. Cunningham
*Attorney, Agent, or Firm*—Daniel J. Bedell; Smith-Hill and Bedell

[57] ABSTRACT

A programmable and precise voltage-to-current converter (a.k.a. current source) that tracks temperature variations is presented. The voltage-to-current converter is implemented by placing a voltage reference circuit between the bases of the two transistors, or alternatively between a diode and a transistor, in a voltage controlled current source circuit which can be adjusted to track temperature variations. In one embodiment, the voltage reference circuit is a programmable digital-to-analog (D/A) converter. In a second embodiment, the voltage reference circuit is a differential amplifier.

19 Claims, 4 Drawing Sheets

TEMPERATURE TRACKING VOLTAGE TO CURRENT CONVERTER

FIELD OF THE INVENTION

The invention generally relates to signal converters, and more particularly relates to voltage-to-current converters.

BACKGROUND OF THE INVENTION

As part of their quality assurance, semiconductor device makers systematically perform tests on their products to ensure that they meet or exceed all of their design parameters. Among the types of tests routinely performed include device parametric testing (a.k.a. DC testing), device logic function testing, and device timing testing (a.k.a. AC testing). While the semiconductor device being tested is often referred to as the Device Under Test, the test system used in conducting the above tests on the DUT is often referred to as Automatic Test Equipment (ATE).

The ATE is necessarily very precise to carry out the aforementioned tests on very sensitive DUT like semiconductor devices. In general, the ATE hardware is controlled by a computer which executes a test program to present the correct voltages, currents, timings, and functional states to the DUT and monitor the response from the device for each test. The result of each test is then compared to pre-defined limits and a pass/fail decision is made. As such, the ATE hardware normally include a collection of power-supplies, meters, signal generators, pattern generators, etc.

The Pin Electronics (PE) circuitry provides the interface between the ATE and the DUT. More particularly, the PE circuitry supplies input signals to the DUT and receives output signals from the DUT. As an example, in parametric testing, either an input voltage is sent to the DUT and an output current is received from the DUT or an input current is sent to the DUT and an output voltage is received from the DUT. Accordingly, a programmable current source is one of the PE's required components to drive desired currents to the DUT.

Figure 1:
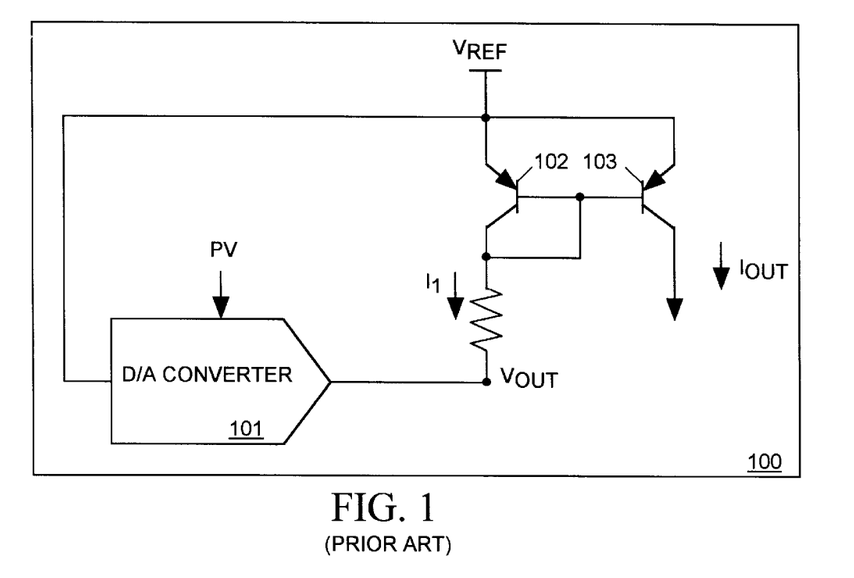
FIG. 1 illustrates a first prior art current source circuit.

FIG. 1 illustrates, as an example, a prior art current source used in a PE circuitry. As shown in FIG. 1, prior art current source 100 comprises digital-to-analog (D/A) converter 101, bipolar transistors 102–103, and resistor $R_{Iset}$. D/A converter 101 receives as inputs an analog reference voltage $V_{refin}$ and a digital programmed value PV from the test computer. In response, D/A converter 101 outputs an analog voltage $V_{out}$. The output of D/A converter 101 is connected to resistor $R_{iset}$ which in turn is connected to the collector of transistor 102. The base of transistor 102 is connected to the base of transistor 103. Moreover, the base of transistor 102 is also connected to the collector of transistor 102. The emitter of transistor 102 is connected to a power voltage $V_{ref}$. While the emitter of transistor 103 is also connected to voltage $V_{ref}$, the collector of transistor 103 supplies the output current $I_{out}$ of current source 100.

In so doing, transistors 102–103 and resistor $R_{iset}$ form a current mirror wherein a current is drawn away from the collector of transistor 102 which causes an emitter-collector current to flow. Because transistors 102 and 103 are identical, a substantially equal emitter-collector current is provided as $I_{out}$. Examining transistor 102, from Kirchoff's voltage law:

$$V_{EB}+V_{BC}+V_{CE}=0$$

Because the base is connected to the collector, $V_{BC}=0$. As such, the above equation becomes $$V_{CE}=-V_{EB} \quad (1)$$

From Ohm's law, $$I_1=(V_{ref}-V_{BE}-V_{out})/R_{iset} \quad (2)$$

Well-known programmable D/A converter functional characteristics dictate that $$V_{out}=V_{ref}*(PV/FS) \quad (3)$$

where PV is the digital programmed value and FS is the full scale digital value of the D/A converter.

Substituting equation (3) into equation (2), $$I_1=((V_{ref}-V_{BE})-(V_{ref}*(PV/FS)))/R_{iset}=(V_{ref}*(1-(PV/FS))-V_{BE})/R_{iset} \quad (4)$$

From Kirchoff's current law, $$I_{Emitter}+I_{Base}+I_{Collector}=0$$

Current $I_{Base}$ is approximately equal to $I_{Emitter}/H_{fe}$, where $H_{fe}$ is the transistor gain which is typically in the range of 150–300. Therefore, $I_{Base}$ is negligible compared to $I_{Emitter}$ and $I_{Collector}$. For this reason, $$-I_{Emitter}=I_{Collector}=I_1 \quad (5)$$

Equation (5) is applicable to both transistors 102 and 103. Because $I_E$ for both transistors 102 and 103 are the same, $$I_1=I_{out} \quad (6)$$

Since it is well known that $V_{BE}$ is related to temperature according to the equation:

$$I_E \sim \exp(qV_{BE}/kT) \quad (7)$$

wherein q is the electronic charge, k is Boltzmann's constant, and T is temperature. Solving equation (7) for $V_{BE}$, $$V_{BE} \approx (kT/q)\ln(I_E) \quad (8)$$

Figure 1A:
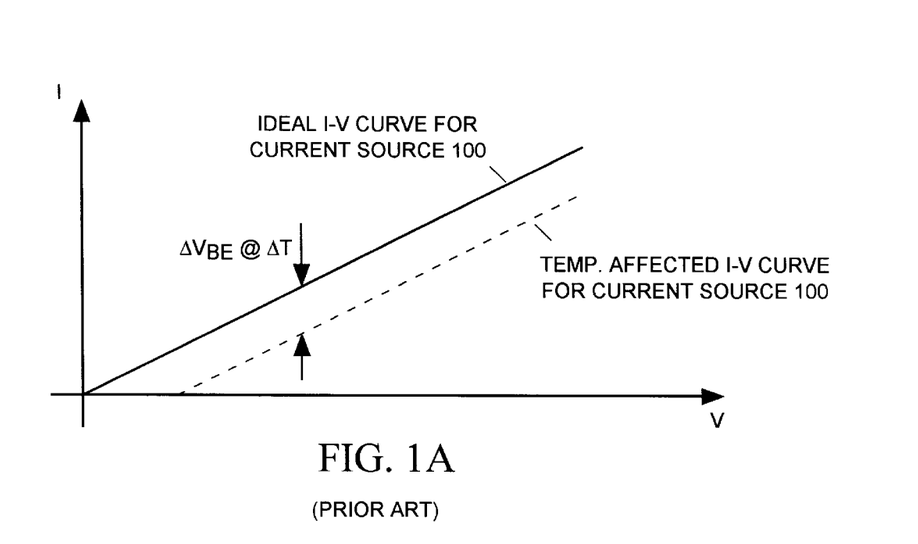
FIG. 1A illustrates the I–V curves of the first prior art current source circuit with the $\Delta V_{BE} @ \Delta T$ error band superimposed.

As can be seen from equation (4), $I_{out}$ depends on $V_{BE}$. Thus, under prior art current source 100, the output current $I_{out}$ is affected by temperature variations which in turn affect the precision of the current source. Moreover, prior art current source 100 error $\Delta V_{BE}@\Delta T$ is constant over the full operating range, as shown in FIG. 1A, making it impossible to accurately program small values. This can be illustrated by the following example. Assume that $V_{Ref}=5V$, $I_0=1$ mA, $V_{BE}=0.6V$, and that the D/A converter is a 12-bit converter. The resolution for this 12-bit D/A converter is $5V/2^{12}$ bit=1.22 mV/bit. From equation (8), the change $\Delta V_{BE}$ with respect to temperature variations can be determined. However, for silicon as a material, it is common knowledge that $\Delta V_{BE}=-2.5$ mV/° C. Thus, a change of 1° C. represents a 200% error at the minimum current setting. Following this logic, a change of 25° C.=−62.5 mV which translates to an error equal in magnitude to the lower 6 bits of a 12-bit D/A converter.

Figure 2:
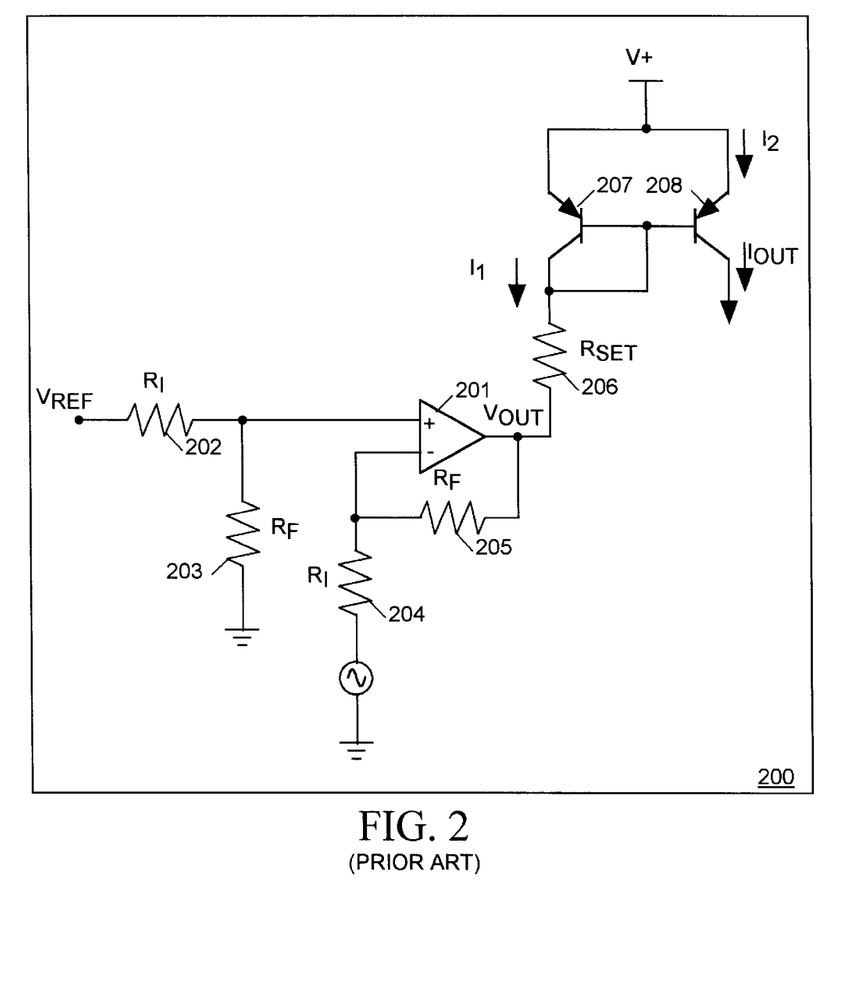
FIG. 2 illustrates a second prior art current source circuit.

Referring now to FIG. 2 illustrating another prior art current source. As shown in FIG. 2, prior art current source 200 consists of a differential amplifier whose output is connected to the bases of the transistors in a current mirror circuit. The differential amplifier consists of operational amplifier (op-amp) 201, resistor $R_I$ 202, resistor $R_F$ 203, resistor $R_I$ 204, and resistor $R_F$ 205. Resistors $R_I$ 202 and $R_F$ 203 are connected in parallel to the non-inverted input of op-amp 201. Resistor $R_I$ 202 is in turn connected to reference voltage $V_{Ref}$. Conversely, resistor $R_F$ 203 is in turn connected to ground. Resistor $R_I$ 204 and $R_F$ 205 are connected in parallel to the inverted input of op-amp 201. Resistor $R_I$ 204 is in turn connected to a voltage source $V_I$. Resistor $R_F$ 205 is in turn connected to the output of op-amp 201.

The output of op-amp 201 is connected to resistor $R_{set}$ 206 which in turn is connected to the collector of transistor 207 of the current mirror. The bases of transistors 207 and 208 are connected together as well as to the collector of transistor 207. The emitters of transistors 207 and 208 are connected together as well as to voltage $V_+$. Finally, the collector of transistor 208 provides the output current for current source 200.

An circuit analysis of current source 200 shows that:

$$I_1 \approx I_2 \approx I_{out} I_{out} = (V_+ - V_{BE1} - V_{out})/R_{set} \tag{9}$$

where $V_{BE1}$ is the base-emitter voltage of transistor 207 and $V_{out}$ is the output voltage of op-amp 201.

Since voltage $V_{out}$ is also the output voltage of the differential amplifier, $$V_{out} = (V_{Ref} - V_i) * (R_F/R_I) \tag{10}$$

Substituting equation (10) into equation (9), the output current is defined as:

$$I_{out} = (V_+ - V_{BE} - (V_{Ref} - V_i)) * (R_F/R_I)/R_{set} \tag{11}$$

where $V_{BE} = V_{BE1} = V_{BE2}$.

Accordingly, like prior art current source 100, prior art current source 200 depends on voltage $V_{BE}$ which is subject to changes due to temperature variations which in turn greatly affect the precision of the current source. As demonstrated earlier, a change of 1° C. represents a 200% error at the minimum current setting. Moreover, prior art current source 200 error is constant over the full operating range making it impossible to accurately program small values.

On the other hand, U.S. Pat. No. 4,251,743 issued Feb. 17, 1981 to Hareyama (hereinafter Hareyama) discloses a current source designed for used in an Analog-to-Digital (A/D) converter which compensates for temperature variations as well as changes of components' characteristics such as aging. The current source disclosed in Hareyama also implements the current mirror concept. However, the current source disclosed in Hareyama implements feedback control (i.e., closed loop control) of its output current $I_{out}$ to compensate for errors. As a result, in addition to requiring more hardware, the current source disclosed in Hareyama requires may not be as precise and responsive as desired due to the inherent characteristics (e.g., residual error and time lag) of feedback control.

Thus, a need exists for a precise current source circuit for use in a computer controlled ATE which has good dynamic range that is able to cancel out or compensate for current changes caused by temperature variations.

SUMMARY OF THE INVENTION

Accordingly, the present invention provides a precise voltage-to-current converter (current source) circuit for use in a computer controlled ATE which has that is able to cancel out or compensate for current changes induced by variations in the current source transistor's base-emitter voltage drop caused by temperature and process variations.

The present invention meets the above need with a current source circuit which comprises a voltage reference circuit and a voltage controlled current source. The voltage controlled current source circuit has a first and second transistor each having a base, a collector, and an emitter. In the preferred embodiment, the two transistors are co-located on a single substrate thereby insuring that they have similar electrical and thermal characteristics. The emitters of the first and second transistors are coupled to a first voltage. Moreover, the collector and the base of the first transistor are connected together. The collector of the second transistor provides an output current for the current source circuit.

The voltage reference circuit is coupled between the bases of the first and second transistors. The voltage reference circuit can be adjusted either manually or automatically to set or program the desired output current. The first transistor provides a temperature tracking reference for the control element.

In one embodiment of the present invention, the voltage reference circuit is a programmable digital-to-analog (D/A) converter. In another embodiment of the present invention, the voltage reference circuit is a variable differential amplifier.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention. Furthermore, while the following detailed description of the present invention describes its application primarily in Automatic Test Equipment (ATE), it is to be appreciated that the present invention can be used in any apparatus or system requiring a current source.

Figure 3:
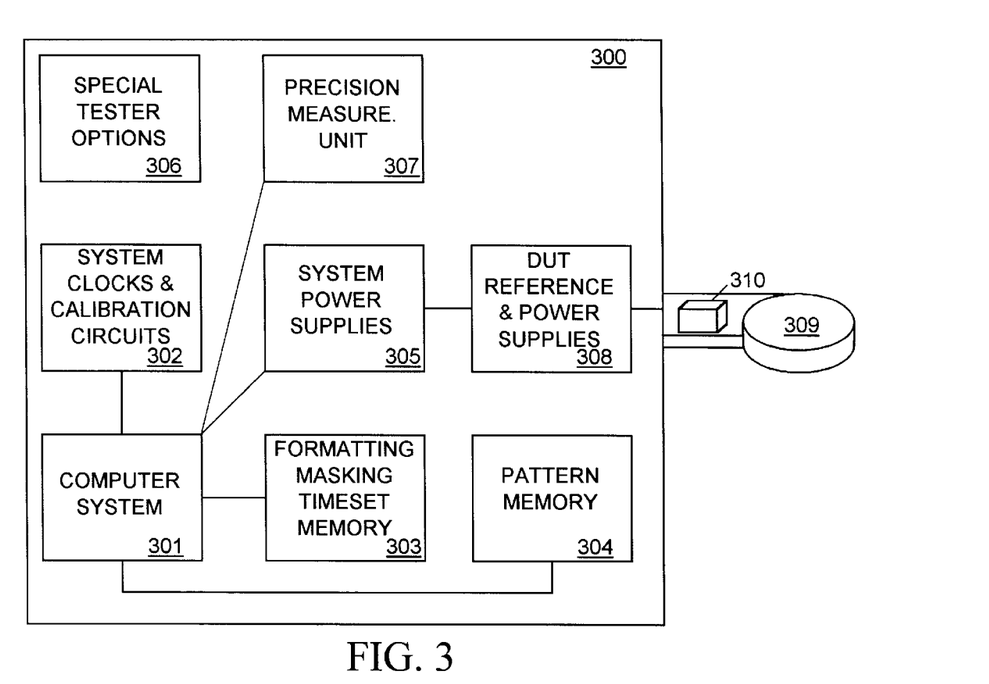
FIG. 3 is a high-level block diagram illustrating a typical computer controlled Automatic Test Equipment (ATE) that implements the present invention.

FIG. 3 illustrates, for example, a high-level diagram of a computer controlled ATE 300 in which the present invention may be implemented or practiced. As shown in FIG. 3, ATE 300 may comprise computer system 301, system clocks and calibration circuits 302, formatting-masking-timeset memory 303, pattern memory 304, system power supplies 305, special tester options unit 306, precision measurement unit 307, DUT reference & power supplies 308, test head 309, and bin box 310.

Computer system 301 is the system controller. Computer system 301 controls ATE 300 and supplies a means to transfer data to/from ATE 300. Hence, computer system 301 may generally include a central processing unit (CPU), input/output (I/O) interfaces such as parallel and serial ports, communications interface for networking and communicating with the outside world, video/graphics controller, a number of data storage devices such as hard drive and tape drive for locally storing information, I/O devices such as keyboard and video monitor to allow the operator to interact with ATE 300. It is to be appreciated that computer system 300 can be any one of a number of different computer systems including desk-top computer systems, general purpose computer systems, embedded computer systems, and others.

System clocks and calibration circuits 302 provide the ATE system clocks for timing its operations and allow for ATE system calibrations. Pattern memory 304 is used to store test vector pattern data (i.e., a representation of the I/O states for the various logical functions that the DUT is designed to perform). Formatting-masking-timeset memory 303 is used to store formatting, masking, and timeset data which modify test vector pattern data before sending it to the DUT as well as create signal formats (wave shapes) and timing edge markers for input signals and strobe timing for sampling output signals. System power supplies 305 provide steady and uninterrupted alternating current (AC) power to ATE 300.

Special tester options unit 306 contains optional circuits to allow ATE 300 to be customized for carrying out predetermined tests. Precision measurement unit 307 allows ATE 300 to make accurate direct current (DC) measurements. DUT reference & power supplies 308 supply DC power (e.g., $V_{DD}$, $V_{CC}$, etc.) to the Device Under Test (DUT). Additionally, DUT reference & power supplies 308 supply input and output reference voltages (e.g., VIL/VIH, VOL/VOH) to the DUT. Test head 309 contains pin electronics (PU) circuitry and interfaces to the load board on which the DUT is placed. Bin box 310 is located near test head 309 and typically contains START and RESET buttons and displays pass/fail results.

Depending on its test purposes, it is to be appreciated that an ATE may have more or fewer than the components discussed above. Further, it should be clear that the components of the ATE discussed above are conventional and well known by people of ordinary skill in the art.

The voltage-to-current converter (the current source) under the present invention is implemented as part of the PE circuitry inside test head 309. In accordance to a first embodiment of the present invention, by implementing a programmable digital-to-analog (D/A) converter between the bases of the two transistors in a voltage controlled current source circuit, a dynamic, programmable, and open-loop current source can be constructed. Under this embodiment, the current source can be programmed by computer system 301 to send the desired current to the DUT.

Figure 4:
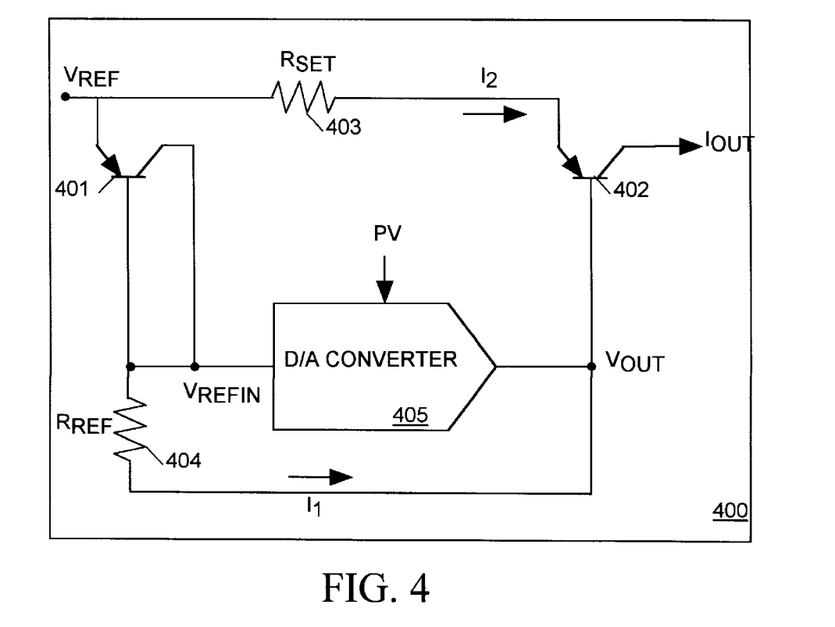
FIG. 4 is a block diagram illustrating a first embodiment of the current source circuit in accordance to the present invention.

Reference is now made to FIG. 4 illustrating the first embodiment of the current source in accordance to the present invention. As shown in FIG. 4, current source 400 consists of bipolar transistors 401–402, resistor $R_{set}$ 403, resistor $R_{ref}$ 404, and programmable D/A converter 405. Preferably, transistors 401 and 402 are located on the same substrate so that their electrical and thermal characteristics are substantially matched. Also, resistor $R_{set}$ 403 and resistor $R_{ref}$ 404 are substantially equal. The emitter of transistor 401 receives a reference voltage $V_{ref}$ and is also connected to resistor $R_{set}$ 403. The base of transistor 401 is connected to resistor $R_{ref}$ 404, the collector of transistor 401, and the voltage reference input of D/A converter 405. D/A converter 405 receives a programmable value PV from computer system 401. Its output is connected to the base of transistor 402 which is also connected to resistor $R_{ref}$ 404. The emitter of transistor 402 is connected to resistor $R_{set}$ 403. The collector of transistor 402 provides the output $I_{out}$ for current source 400.

In so doing, transistors 401–402, resistor $R_{set}$ 403, and resistor $R_{ref}$ 404 make up a voltage controlled current source wherein transistor 401 provides the temperature tracking voltage reference and transistor 402 acts as a voltage-to-current converter. Further, it should be clear to a person of ordinary skill in the art that with its base connected to its collector, transistor 401 acts like a diode device. Hence, a diode device that has similar characteristics may replace transistor 401. Programmable D/A converter 405 is placed between the bases of transistors 401 and 402 to allow current source 400 to be programmable. As such, programmable D/A converter 405 acts as the voltage reference circuit. The D/A converter's voltage reference input and hence its output will now track transistor 402 $\Delta V_{BE}$.

A circuit analysis of current source 400 is performed to determine an equation for the output current $I_{out}$. It is well known that the voltage $V_{out}$ of a programmable D/A converter is equal to:

$$V_{out} = V_{Refin} * (PV/FS) \tag{12}$$

where PV is the digital programmable value from controlled system computer 301 and FS is the digital full scale value of D/A converter 405.

Following the logic of the analysis in deriving equation (4) in the background section, current $I_1$ is determined to be:

$$I_1 = (V_{Ref} - V_{BE1} - V_{out})/R_{Ref} \tag{13}$$

where $V_{BE1}$ is the voltage between the base and emitter of transistor 401. Similarly, current $I_2$ is:

$$I_2 = (V_{Ref} - V_{BE2} - V_{out})/R_{set} \tag{14}$$

Since $V_{BE1} = V_{BE2}$ (transistors 401 and 402 are substantially equivalent) and $R_{set} = R_{Ref}$, it can be shown that $I_1 \approx I_2$. From Kirchoff's current law:

$$I_2 = I_{out} + I_{Base} \tag{15}$$

where $I_{Base}$ is the base current of transistor 402.

Current $I_{Base}$ is approximately equal to $I_2/H_{fe}$, where $H_{fe}$ is the transistor gain which is typically in the range of 150–300. Thus, $I_{Base}$ is negligible and $I_2 \approx I_{out}$ under equation (15). Substituting equation (12) into equation (15):

$$I_2 \approx I_{out} = (V_{Ref} - V_{BE2} - (V_{Refin} * (PV/FS)))/R_{set} \tag{16}$$

By inspection, $V_{Refin} = V_{Ref} - V_{BE1} = V_{Ref} - V_{BE2}$. When this is substituted into equation (16), equation (16) becomes:

$$I_{out} = (V_{Ref} - V_{BE2} - ((V_{Ref} - V_{BE2}) * (PV/FS)))/R_{set} \tag{17}$$

Factoring out the term $((V_{Ref} - V_{BE2})/R_{set})$ equation (17) becomes:

$$I_{out} = ((V_{Ref} - V_{BE2})/R_{set}) * (1 - (PV/FS)) \tag{18}$$

Figure 4A:
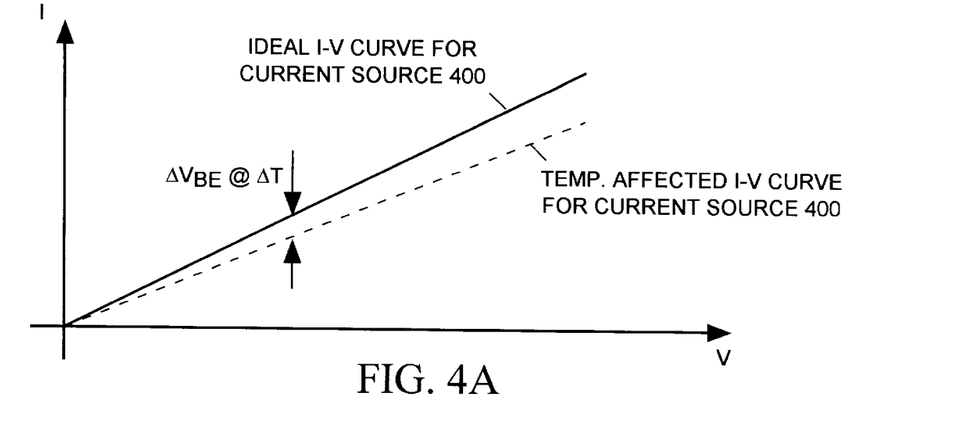
FIG. 4A illustrates the I–V curves of the first embodiment of the current source circuit in accordance to the present invention with the $\Delta V_{BE} @ \Delta T$ error band superimposed.

From equation (17), it can be seen that when the ratio (PV/FS) approaches unity, the $V_{BE}$ terms cancel out as $I_{out}$ approaches zero. The significance of this is that small values of current can be programmed with negligible temperature affect. Referring now to FIG. 4A illustrating, as an example, the I–V curves of the first embodiment in accordance to the present invention. As shown in FIG. 4A, under the present invention, the error $\Delta V_{BE}@\Delta T$ is proportional to the current. Hence, at very low current values, the error $\Delta V_{BE}@\Delta T$ is essentially reduced to zero (0).

Moreover, under the present invention, there is no unusable range and no offset changes because $V_{Refin}$ tracks the $V_{BE}$ voltage of transistor 402. And, in accordance to the present invention, the whole voltage operating range of the current source is available. This can be illustrated by the considering the same example discussed earlier in the background. As before, assume that $V_{Ref}$=5V, $I_0$=1 mA, $V_{BE}$= 0.6V, and that the D/A converter is a 12-bit converter. The resolution for this 12-bit D/A converter is $5V/2^{12}$ bit=1.22 mV/bit. Unlike the prior art example, the current $I_{out}$ under equation (18) is maximum when PV is 0 and minimum when PV=FS. Hence, there is no unusable voltage range and no unusable D/A converter bit range in accordance to the present invention.

Figure 5:
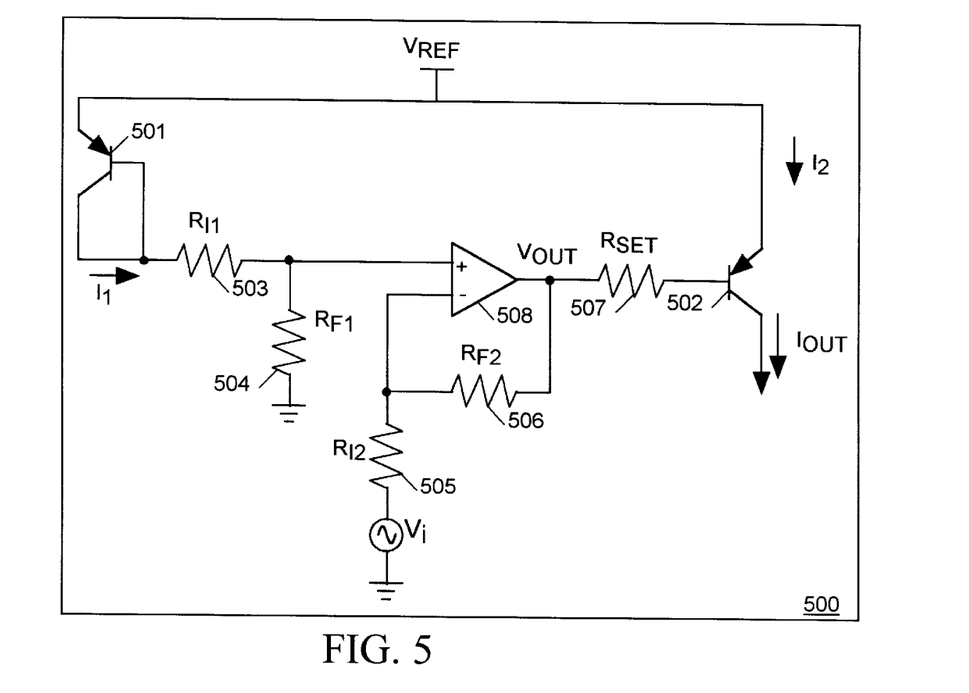
FIG. 5 is a block diagram illustrating a second embodiment of the current source circuit in accordance to the present invention.

In accordance to a second embodiment of the present invention, by implementing a variable differential amplifier between the bases of the two transistors in a current mirror circuit, a dynamic, variable, and open-loop current source can be constructed. Under this embodiment, the current source can be varied by changing the values of resistors $R_I$ and $R_F$ to program the desired current to the DUT.

Referring now made to FIG. 5 illustrating a second embodiment of the current source in accordance to the present invention. As shown in FIG. 5, current source 500 consists of bipolar transistors 501–502, resistor $R_{I1}$ 503, resistor $R_{F1}$ 504, resistor $R_{I2}$ 505, resistor $R_{F2}$ 506, resistor $R_{set}$ 507, and operational amplifier (op-amp) 508. Preferably, transistors 501 and 502 are located on the same substrate so that their electrical and thermal characteristics are substantially matched. Also, resistor $R_{I1}$ 503 and resistor $R_{F1}$ 504 are preferably equal to their counterparts resistor $R_{I2}$ 505 and resistor $R_{F2}$ 506. However, depending on needs, it is to be appreciated that resistor $R_{I1}$ 503 can have a different value than its counterpart resistor $R_{I2}$ 505 and resistor $R_{F1}$ 504 can have a different value than its counterpart resistor $R_{F2}$ 506.

The emitter of transistor 501 receives a reference voltage $V_{ref}$. The base of transistor 501 is connected to resistor $R_{I1}$ 503 and the collector of transistor 501. Resistor $R_{I1}$ 503 is in turn connected to the non-inverted input of op-amp 508. Resistor $R_{F1}$ 504, which is in parallel to resistor $R_{I1}$ 503, is also connected to the non-inverted input of op-amp 508. The other end of resistor $R_{F1}$ 504 is connected ground GND. The inverted input of op-amp 508 is connected to resistor $R_{I2}$ 505 which in turn is connected to the voltage source $V_i$. The inverted input of op-amp 508 is also connected to $R_{F2}$ 506 which in turn is connected to the output of op-amp 508. The output of op-amp 508 is connected to resistor $R_{set}$ 507 which in turn is connected to the base of transistor 502. The emitter of transistor 502 receives voltage $V_{Ref}$. The collector of transistor 502 provides the output current $I_{out}$ of current source 500.

In so doing, transistors 501 and 502 make up a voltage controlled current source circuit wherein transistor 501 provides temperature tracking voltage reference and transistor 502 is the voltage-to-current converter. Further, it should be clear to a person of ordinary skill in the art that with its base connected to its collector, transistor 501 acts like a diode device. Hence, a diode device with similar characteristics may replace transistor 501. On the other hand, op-amp 508, resistor $R_{I1}$ 503, resistor $R_{F1}$ 504, resistor $R_{I2}$ 505, and resistor $R_{F2}$ 506 make up a differential amplifier which together with resistor Rset 507 are placed between the bases of transistors 501 and 502 to act as a voltage reference circuit wherein the values of resistors $R_{Ii}$ and $R_{Fi}$ is used to program the desired current to the DUT. The voltage reference circuit's voltage reference input and hence its output will now track transistor 502 $\Delta V_{BE}$.

A circuit analysis of the differential amplifier indicates that:

$$V_{out}=(R_F/R_I)*(V_{Ref}-V_{BE1})-V_i) \quad (19)$$

where $R_{I1}$ 503=$R_{I2}$ 505=$R_I$ and $R_{F1}$ 504=$R_{F2}$ 506=$R_F$ and $V_{BE1}$ is the base-emitter voltage of transistor 501.

The output current $I_{out}$ is equal to:

$$I_{out}=(V_{Ref}-V_{BE2}-V_{out})/R_{set} \quad (20)$$

where $V_{BE2}$ is the base-emitter voltage of transistor 502.

By substituting equation (19) into equation (20), equation (20) then becomes:

$$I_{out}=(V_{Ref}-V_{BE2}-((V_{Ref}-V_{BE1})-V_i)*(R_F/R_I))/R_{set} \quad (21)$$

If $R_F/R_I$=1, then $V_{BE2}=V_{BE1}$ and equation (21) is reduced to:

$$I_{out}=V_i/R_{set} \quad (22)$$

According to equation (22), the output current $I_{out}$ is not dependent on $V_{BE}$ and therefore, is not subject to temperature variations. Therefore, the second embodiment of the present invention can operate with small values of current since the temperature affect is negligible. Moreover, under the present invention, there is no unusable range and no offset changes because $V_{Refin}$ tracks the $V_{BE}$ voltage of transistor 502.

The two embodiments of the present invention, a current source (a.k.a. voltage-to-current converter) circuit, are thus described. While the present invention has been described in particular embodiments, the present invention should not be construed as limited by such embodiments, but rather construed according to the below claims.

What is claimed is:

1. A current source circuit comprising:
    a voltage controlled current source circuit comprising first and second transistors each having a base, a collector, and an emitter, the emitters of the first and second transistors being coupled to a first voltage, the collector and the base of the first transistor being connected together, the collector of the second transistor providing an output current for the current source circuit; and
    a voltage reference circuit coupled between the bases of the first and second transistors for producing a control voltage at the base of said second transistor in response to a control signal appearing at the base of said first transistor, wherein a magnitude of said control voltage varies with temperature of the first transistor,
    wherein the voltage reference circuit comprises a programmable digital-to-analog (D/A) converter for receiving input control data and said control signal and for producing said control voltage of magnitude determined by a combination of magnitudes of said control signal and said control data.

2. The current source circuit of claim 1 further comprising:

a first resistor coupled between the bases of the first and second transistors; and a second resistor coupled between the emitters of the first and second transistors.

3. The current source circuit of claim 2, wherein the output current has a magnitude $I_{out}$ in accordance with the equation:

$$I_{out}=((V_{Ref}-V_{BE2})/R_{set})*(1-(PV/FS))$$

where $V_{Ref}$ is a magnitude of the first voltage, $V_{BE2}$ is a magnitude of the base-emitter voltage of the second transistor, $R_{set}$ is a magnitude of the second resistor, PV is a current valve of the control data, and FS is a maximum valve of the control data.

4. A current source circuit comprising:

a voltage controlled current source circuit comprising first and second transistors each having a base, a collector, and an emitter, the emitters of the first and second transistors being coupled to a first voltage, the collector and the base of the first transistor being connected together, the collector of the second transistor providing an output current for the current source circuit;

a voltage reference circuit coupled between the bases of the first and second transistors for producing a control voltage at the base of said second transistor in response to a control signal appearing at the base of said first transistor, wherein a magnitude of said control voltage varies with temperature of the first transistor, wherein the voltage reference circuit comprises a differential amplifier amplifying said control signal to produce said control voltage, and a first resistor coupled between the differential amplifier and the base of the second transistor, wherein the differential amplifier comprises:

an operational amplifier (op-amp) having an inverted input, a non-inverted input, and an output;

a second resistor connected to the non-inverted input of the op-amp;

a third resistor coupled between the non-inverted input of the op-amp and a second voltage;

a fourth resistor coupled between the inverted input of the op-amp and a voltage source; and a fifth resistor coupled between the inverted input and the output of the op-amp.

5. The current source of claim 4, wherein the second and fourth resistors have substantially equal resistance and the third and fifth resistors have substantially equal resistance.

6. The current source of claim 5, wherein the output current has a magnitude $I_{out}$ in accordance with the equation:

$$I_{out}=(V_{Ref}-V_{BE2}-((V_{Ref}-V_{BE1})-V_I)*(R_F/R_I))/R_{set}$$

where $V_{Ref}$ is the first voltage, $V_{BE1}$ is the base-emitter voltage of the first transistor, $V_{BE2}$ is a base-emitter voltage of the second transistor, $V_I$ is a magnitude of the second voltage, $R_F$ is a resistance of the fourth resistor, $R_I$ is a resistance of the second resistor, and $R_{set}$ is a resistance of the first resistor.

7. An Automatic Test Equipment (ATE) comprising:

a test head comprising a pin electronics (PE) circuit for supplying input signals to a device under test (DUT) and for receiving output signals from the DUT, the PE circuit comprising a current source circuit comprising:

a voltage controlled current source circuit comprising first and second transistors each having a base, a collector, and an emitter, the emitters of the first and second transistors being coupled to a first voltage, the collector and the base of the first transistor being connected together, the collector of the second transistor providing an output current for the current source circuit; and a voltage reference circuit coupled between the bases of the first and second transistors for producing a control voltage at the base of said second transistor in response to a control signal appearing at the base of said first transistor, wherein a magnitude of said control voltage varies with temperature of the first transistor, wherein the voltage reference circuit comprises a programmable digital-to-analog (D/A) converter for receiving input control data and said control signal and for producing said control voltage of magnitude determined by a combination of magnitudes of said control signal and said control data.

8. The ATE of claim 7, wherein the current source further comprising:

a first resistor coupled between the bases of the first and second transistors; and a second resistor coupled between the emitters of the first and second transistors.

9. The ATE source circuit of claim 8, wherein the output current has a magnitude $I_{out}$ in accordance with the equation:

$$I_{out}=((V_{Ref}-V_{BE2})/R_{set})*(1-(PV/FS))$$

where $V_{Ref}$ is a magnitude of the first voltage, $V_{BE2}$ is a magnitude of the base-emitter voltage of the second transistor, $R_{set}$ is a magnitude of the second resistor, PV is a current value of the control data, and FS is a maximum value of the control data.

10. An Automatic Test Equipment (ATE) comprising a test head comprising a pin electronics (PE) circuit for supplying input signals to a device under test (DUT) and for receiving output signals from the DUT, the PE circuit comprising a current source circuit comprising:

a voltage controlled current source circuit comprising first and second transistors each having a base, a collector, and an emitter, the emitters of the first and second transistors being coupled to a first voltage, the collector and the base of the first transistor being connected together, the collector of the second transistor providing an output current for the current source circuit;

a voltage reference circuit coupled between the bases of the first and second transistors for producing a control voltage at the base of said second transistor in response to a control signal appearing at the base of said first transistor, wherein a magnitude of said control voltage varies with temperature of the first transistor, wherein the voltage reference circuit comprises a differential amplifier amplifying said control signal to produce said control voltage, and a first resistor coupled between the differential amplifier and the base of the second transistor, wherein the differential amplifier comprises:

an operational amplifier (op-amp) having an inverted input, a non-inverted input, and an output;

a second resistor connected to the non-inverted input of the op-amp;

a third resistor coupled between the non-inverted input of the op-amp and a second voltage;

a fourth resistor coupled between the inverted input of the op-amp and a voltage source; and a fifth resistor coupled between the inverted input and the output of the op-amp.

11. The ATE of claim 10, wherein the second and fourth resistors are of substantially equal resistance and the third and fifth resistors are of substantially equal resistance.

12. The ATE of claim 11, wherein the output current has a magnitude $I_{out}$ in accordance with the equations:

$$I_{out}=(V_{Ref}-V_{BE2}-((V_{Ref}-V_{BE1})-V_I)*(R_F/R_I))/R_{set}$$

where $V_{Ref}$ is a magnitude of the first voltage, $V_{BE2}$ is a magnitude of the base-emitter voltage of the second transistor, $R_{set}$ is a magnitude of the second resistor, PV is a current valve of the control data, and FS is a maximum valve of the control data.

13. A method for converting voltage into an output current comprising the steps of:
 in a voltage controlled current source circuit comprising first and second transistors each having a base, a collector, and an emitter, the emitters of the first and second transistors being coupled to a first voltage, the collector and the base of the first transistor connected together, providing said output current at the collector of the second transistor; and
 producing a control voltage at the base of said second transistor in response to a control signal appearing at the base of said first transistor, wherein a magnitude of said control voltage varies with temperature of the first transistor,
 wherein the step of producing said control voltage comprises the substeps of:
  connecting an input of a programmable digital-to-analog (D/A) converter to said base of said first transistor, and
  connecting an output of said D/A converter to the base of said second transistor.

14. A current source circuit comprising:
 a voltage controlled current source comprising a diode having an input and an output and a first transistor having a base, a collector, and an emitter, the input of the diode and the emitter of the first transistor being coupled to a first voltage, the collector of the first transistor providing an output current for the current source circuit; and
 a voltage reference circuit coupled between the output of the diode and the base of the first transistor for producing a control voltage at the base of said first transistor in response to a control signal appearing at the output of said diode, wherein a magnitude of said control voltage varies with a temperature of the diode,
 wherein the voltage reference circuit comprises a programmable digital-to-analog (D/A) converter.

15. An apparatus for generating an output current of magnitude controlled by input data, comprising:
 a first voltage source:
  a first transistor having a first base, a first collector and a first emitter, the first emitter being coupled to said first voltage source, said output current being generated in the first collector;
  a digital-to-analog (D/A) converter, having a first input receiving a reference signal and having a second input receiving said input data, for producing a control voltage of magnitude determined by a combination of magnitudes of said reference signal and said input data, said control voltage being applied to said first base; and
  a diode providing a conductive path between said first voltage source and said first input of said D/A converter thereby supplying said reference signal to said DAC, wherein the magnitude of said control voltage varies with temperature of said diode.

16. The current source in accordance with claim 15 wherein said diode is formed by a second transistor having a second base, a second collector and a second emitter, the second emitter being coupled to said first voltage source and the second base and second collector being coupled to said first input of said D/A converter.

17. The current source in accordance with claim 16 wherein said first transistors and said second transistor are substantially similar.

18. The current source in accordance with claim 17 further comprising:
 a first resistor coupling said second emitter to said first voltage source, and
 a second resistor coupling said second base to said first base,
 wherein said first and second resistors are of substantially similar resistance.

19. A current source for generating an output current comprising:
 a first voltage source:
 a first transistor having a first base, a first collector and a first emitter, the first emitter being coupled to said first voltage source, said output current being generated in the first collector;
 an amplifier circuit having an amplifier input for receiving a reference current and for producing a control voltage at said first base of said first transistor in response to said reference current; and
 a diode for connected for conducting said reference current between first voltage source and said amplifier input,
 wherein said diode is formed by a second transistor having a second base, a second collector and a second emitter, the second emitter being connected to said first voltage source and said second base and said second collector being connected to said amplifier input,
 wherein said first transistor and said second transistor have substantially similar electrical and thermal characteristics, and
 wherein said amplifier circuit comprises:
  a circuit ground;
  an operational amplifier having a first operational amplifier input, a second operational amplifier input, and an operational amplifier output;
  a first resistor connecting said second collector and said second base to said first operational amplifier input;
  a second resistor coupling said first operational amplifier input said circuit ground;
  a second voltage source;
  a third resistor coupling said second operational amplifier input to said second voltage source;
  a fourth resistor coupling said operational amplifier output to said first base; and
  a fifth resistor coupling said operational amplifier output to said second operational amplifier input.

* * * * *

UNITED STATES PATENT AND TRADEMARK OFFICE
CERTIFICATE OF CORRECTION

PATENT NO.   : 6,137,346
DATED        : October 24, 2000
INVENTOR(S)  : Charles A. MILLER It is certified that error appears in the above-identified patent and that said Letters Patent is hereby corrected as shown below:

Column 9, line 14 (claim 3, line 8), "valve" should be deleted and replaced with --value--.

Column 9, line 15 (claim 3, line 9), "valve" should be deleted and replaced with --value--.

Column 11, line 5 (claim 12, line 2), "equations" should be deleted and replaced with --equation--.

Column 11, line 11 (claim 12, line 7, "valve" should be deleted and replaced with --value--.

Column 11, line 12 (claim 12, line 8, "valve" should be deleted and replaced with --value--.

Signed and Sealed this

Fifteenth Day of May, 2001

NICHOLAS P. GODICI

*Attest:*

*Attesting Officer*    *Acting Director of the United States Patent and Trademark Office*